(12) United States Patent
Kernbaum et al.

(10) Patent No.: US 10,618,268 B2
(45) Date of Patent: Apr. 14, 2020

(54) METHOD FOR SEPARATING MULTILAYER SYSTEMS

(71) Applicants: Sebastian Kernbaum, Bielefeld (DE); Horst Seibt, Bielefeld (DE)

(72) Inventors: Sebastian Kernbaum, Bielefeld (DE); Horst Seibt, Bielefeld (DE)

(73) Assignee: Saperatec GmbH, Bielefeld (DE)

( * ) Notice: Subject to any disclaimer, the term of this patent is extended or adjusted under 35 U.S.C. 154(b) by 916 days.

(21) Appl. No.: 15/077,210

(22) Filed: Mar. 22, 2016

(65) Prior Publication Data

US 2016/0214368 A1 Jul. 28, 2016

Related U.S. Application Data

(63) Continuation of application No. 13/950,485, filed on Jul. 25, 2013, which is a continuation-in-part of (Continued)

(30) Foreign Application Priority Data

Jan. 25, 2011 (DE) ........................ 10 2011 000 322

(51) Int. Cl.
   *B32B 43/00* (2006.01)
   *C08J 11/08* (2006.01)
   (Continued)

(52) U.S. Cl.
   CPC ............... *B32B 43/006* (2013.01); *B01J 8/00* (2013.01); *B03B 9/061* (2013.01); *C08J 11/06* (2013.01); *C08J 11/08* (2013.01); *C09K 13/00* (2013.01); *C09K 13/02* (2013.01); *H01L 31/042* (2013.01); *B29B 17/02* (2013.01); *B32B 38/10* (2013.01); *C08J 7/02* (2013.01); *Y02E 10/50* (2013.01); *Y02W 30/20* (2015.05); *Y02W 30/701* (2015.05); (Continued)

(58) Field of Classification Search
   CPC ....... B32B 38/10; B32B 43/00; B32B 43/006; C08J 11/06; C08J 11/08; C08J 7/02; B29B 17/02; Y10T 156/11; Y10T 156/1111; Y10T 156/1121; Y10T 156/19; Y10T 156/1922
   USPC .............................. 156/703, 705, 750, 754
   See application file for complete search history.

(56) References Cited

U.S. PATENT DOCUMENTS 5,628,832 A  5/1997  Graham
5,698,044 A  12/1997 Graham et al.
(Continued)

FOREIGN PATENT DOCUMENTS

CN  101681130     3/2010
DE  44 07 900 A1  9/1995
(Continued)

*Primary Examiner* — Mark A Osele
*Assistant Examiner* — Nickolas R Harm
(74) *Attorney, Agent, or Firm* — 24IP Law Group USA, PLLC; Timothy Dewitt (57) ABSTRACT

A separating fluid, method and use for separating multilayer systems, especially photovoltaic modules, for the purpose of recycling, which allow the separation of multilayer systems. Especially photovoltaic modules, in comparatively simple manner in terms of the processes used, in as environmentally friendly a manner as possible, at high recycling rates. For this purpose, the separating fluid is a nanoscale dispersion or a precursor thereof.

15 Claims, 2 Drawing Sheets

Related U.S. Application Data application No. PCT/EP2012/051172, filed on Jan. 25, 2012.

(51) Int. Cl.
*C08J 11/06* (2006.01)
*H01L 31/042* (2014.01)
*B03B 9/06* (2006.01)
*B01J 8/00* (2006.01)
*C09K 13/00* (2006.01)
*C09K 13/02* (2006.01)
*B29B 17/02* (2006.01)
*B32B 38/10* (2006.01)
*C08J 7/02* (2006.01)

(52) U.S. Cl.
CPC ........... *Y02W 30/827* (2015.05); *Y10T 156/11* (2015.01); *Y10T 156/1111* (2015.01); *Y10T 156/1116* (2015.01); *Y10T 156/1121* (2015.01); *Y10T 156/19* (2015.01); *Y10T 156/1922* (2015.01)

(56) References Cited

U.S. PATENT DOCUMENTS

| | | | |
|---|---|---|---|
| 5,817,183 A | 10/1998 | Eddy-Helenek et al. | |
| 5,952,287 A | 9/1999 | Gross | |
| 5,990,072 A | 11/1999 | Gross | |
| 6,129,847 A | 10/2000 | Wuensch | |
| 6,223,904 B1 * | 5/2001 | Stephan | B29B 17/02 209/3 |
| 6,224,685 B1 | 5/2001 | Gross | |
| 6,391,165 B1 | 5/2002 | Bohland | |
| 6,696,399 B1 | 2/2004 | Chernin | |
| 7,547,670 B2 | 6/2009 | Gross | |
| 7,935,844 B2 | 5/2011 | Bartos | |
| 8,497,140 B2 | 7/2013 | Oi | |
| 2007/0093404 A1 | 4/2007 | Gross | |
| 2009/0271016 A1 | 11/2009 | Cooper | |
| 2010/0056410 A1 | 3/2010 | Visintin | |
| 2010/0112728 A1 | 5/2010 | Korzenski | |
| 2011/0147230 A1 | 6/2011 | Reed | |
| 2011/0266377 A1 | 11/2011 | Lindner | |
| 2012/0042898 A1 | 2/2012 | Visintin | |
| 2012/0267324 A1 | 10/2012 | Mukhopadhyay | |
| 2013/0118691 A1 | 5/2013 | Panagiotis | |

FOREIGN PATENT DOCUMENTS

| | | |
|---|---|---|
| DE | 10 2004 043 893 A1 | 5/2005 |
| DE | 10 2007 034 441 A1 | 1/2009 |
| DE | 10 2008 058 530 A1 | 5/2010 |
| EP | 0 761 731 A2 | 3/1997 |
| EP | 1 975 987 A2 | 10/2008 |
| EP | 2 591 900 A1 | 5/2013 |
| JP | H10-088043 A | 4/1998 |
| JP | H10-120820 A | 5/1998 |
| JP | 2000-044724 A | 2/2000 |
| JP | 2004-042033 A | 2/2004 |
| JP | 2006-520855 A | 9/2006 |
| TW | 200908148 A | 2/2009 |
| WO | 2004/056959 A1 | 7/2004 |
| WO | 2005/065852 | 7/2005 |
| WO | 2007111385 | 10/2007 |
| WO | 2008121952 | 10/2008 |
| WO | 2008157345 | 12/2008 |
| WO | 2009037349 | 3/2009 |
| WO | 2010/017160 | 2/2010 |
| WO | 2010039936 | 4/2010 |
| WO | 2010/052016 A2 | 5/2010 |
| WO | 2010105842 | 9/2010 |
| WO | 2010108639 | 9/2010 |
| WO | 2011/077450 | 6/2011 |
| WO | 2013/051161 A1 | 4/2013 |

* cited by examiner

Fig. 1

| Pos. | |
|---|---|
| | Phase I: Pre-chopping and sorting by size |
| | Phase II: Wash |
| | Phase III: Production of suitable fractions |
| 2 | Manual disassembly |
| 3 | Shredder |
| 4 | Screening |
| 6 | Hammer mill |
| 7 | Extraction with HEPA filter |
| 8 | Air |
| 9 | Microparticles |
| 14 | Separation (swim-sink) |
| 15 | Precious metals |
| 16 | EVA film |
| 17 | NF separation |
| 18 | Glass |
| 19 | Aluminum frame |

Fig. 2

METHOD FOR SEPARATING MULTILAYER SYSTEMS

CROSS RELATION TO OTHER APPLICATIONS

This application is a continuation of U.S. patent application Ser. No. 13/950,485 filed on Jul. 25, 2013, which is a continuation-in-part application of international patent application No. PCT/EP2012/051172 filed on 25 Jan. 2012 claiming priority of German patent application No. 10 2011 000 322.3 of 25 Jan. 2011.

The aforementioned patent applications are hereby incorporated by reference in their entirety.

BACKGROUND OF THE INVENTION

Field of Invention

The present disclosure relates to a separating fluid for separating multilayer systems, in particular in photovoltaic modules, batteries or screens, for the purpose of recycling.

The present invention refers to a method for separating multilayer systems, in particular in photovoltaic modules, for the purpose of recycling, comprising a wash with a separating fluid.

The present invention further to use of a separating fluid for separating multilayer systems, in particular photovoltaic modules, for the purpose of recycling.

Finally, the present disclosure relates to a facility carrying out the above method of the kind named above.

Brief Description of the Related Art

The increasing distribution of photovoltaic modules, electronic components and other objects present in multilayer systems increases the demand for suitable methods and materials for disposal and recycling of decommissioned multilayer systems and wastes arising from their production. Processing and recycling are targeted specifically at the production of secondary raw materials that can be returned to the economic cycle. Questions of environmental protection that are also against disposal of the decommissioned multilayer systems and waste without any processing are playing an increasing role as well. These conditions lead to the requirement that the recycling process in itself should be performed as far as possible in an environmentally friendly manner and compatible with recycling of material.

The methods and separating fluids currently in use are based on the application of chemical and thermal processes for silicon thick-film modules, such as crystalline silicon modules, on the one hand and mechanical and chemical separating processes for recycling of thin-film modules or CdTe-thin-film modules on the other hand.

Two types of photovoltaic modules are known. There are photovoltaic modules based on silicon wafers that are embedded within two glass panes by lamination of ethylenvinylacetate (EVA) and applied to a suitable frame, resulting in silicon-thick-film modules. The other type of photovoltaic cells or photovoltaic modules is produced with thin layers that are applied directly to the glass panes by physical vapor deposition and/or chemical vapor deposition methods. Different thin-film cell varieties are available on the market, such as amorphous silicon, microcrystalline silicon, cadmium telluride, copper indium diselenide and gallium arsenide.

The known methods for recycling the photovoltaic modules are based on a thermal separating process, i.e. the destruction of the EVA bond, in connection with chemical methods for cleaning the resulting silicon wafer or the raw silicon. The methods are energy-intensive and only suitable for thin-film modules within limitations.

Another known method is substantially based on sulfuric acid and hydrogen peroxide causing an etching process that leads to separation of the multilayer system. The disadvantage is that use of such substances is not environmentally compatible and separation and concentration of the recyclable materials after etching may be require elaborate methods.

Other prior art methods result in the entire dissolution of the materials, due to the acids used to remove layers. These other prior art methods require highly energy-consuming and material-consuming methods, such as electrolysis, to separate these dissolved materials from the etching solution used so that the waste materials are available for further use.

SUMMARY OF THE INVENTION

The present disclosure teaches a separating fluid, a method, a use and a facility to enable separation of multilayer systems, for example but not limited to photovoltaic modules, at a high recycling rate and in a manner that is comparatively simple and environmentally compatible.

The separating fluid of this disclosure is a nanoscale dispersion or a precursor of this nanoscale dispersion. The term "nanoscale dispersion" is used as a collective term that comprises micro-emulsions as well as mini-emulsions and refers to a stable, optically isotropic dispersion that contains two non-mixable components and is stabilized by at least one amphiphilic component. A precursor of the nanoscale dispersion is a nanoscale dispersion that, however, has only one of the two non-mixable components. By addition of the missing component to the precursor, the nanoscale dispersion will result from the precursor. The missing component can also be taken from the material to be treated during separation. With the help of the separating fluid, separation of adhesions and coatings is possible by reducing interfacial tensions between the phases of glued and coated materials and causing separation.

In photovoltaic modules, the separating fluid may, for example, separate the glass-glass bond, which is frequently created using EVA or similar substances, or the precious metal coating and/or semi-conductor coating of thin-film modules. The separating fluid can also be applied to separate photovoltaic modules in which a glass-glass connection by PVB film, similar to car glass windshields, is present.

The nanoscale dispersions can be produced cost-efficiently. They nanoscale dispersions also enable mostly loss-free separation and recovery of valuable substances to then be utilized. The nanoscale dispersions can be processed and reused. This re-use is in contrast to the prior art methods, such as etching, in which the recyclable materials are dissolved. The use of the separating fluids of this disclosure enables separation of the valuable materials by simple filtration as the valuable materials coming loose in solid parts.

The separating fluid does not lead to chemical dissolution of materials, but to the layers in the bonding area coming loose in small solid parts, i.e. flakes or strips. Thin layers of metals or semi-conductors or graphite may be removed from substrate carrier layers, such as glass or metal. It is also possible that connected thin layers of two or more thin individual layers are separated into their individual layers. There is no considerable material loss and the fractions of the different materials can be separated from the sludge or suspension in subsequent separating stages.

The nanoscale dispersion is formed of an organic solvent, a watery component and at least one surfactant. The precursor is formed of a watery component and at least one surfactant. The organic component is used for swelling of the plastic when used for separating multilayer systems. The organic component according to the invention also serves to remove any present bonding agents in the multilayer system to support the separation. Use of organic fluids for the organic component can be very different. Selection of the organic fluid depends on the bonds in the solar modules and also on the use of organic bonding agents in the applied thin semi-conductor layers.

The term "aqueous component" means the sum of water in its pure form and all other aqueous shares that are added by addition of further components. Other watery shares increasing the share of the aqueous component in the separating fluid can be contained in aqueous solutions. The share of the aqueous component therefore specifies the share of water in the overall mixture. The water can therefore also be part of other added components.

The surfactant is used to cover the free surfaces and to use capillary forces for the formation of further surfaces. In particular, watery citric acid has turned out to be suitable for the organic component in the scope of the invention.

The organic component contains non-water-soluble oils and/or non-water-soluble solvents.

The aqueous component has a concentration of at least 60 percent by weight, preferably about 70 percent by weight, in the nanoscale dispersion. Concentrations of at least 60 percent by weight and up to 85 percent by weight have turned out to be suitable.

The surfactant is chosen from the group formed of anionic surfactants, non-ionic surfactants, amphoteric surfactants or their combinations. By definition, surfactants have at least one hydrophilic and one hydrophobic functional group. Anionic surfactants as a functional group usually have carboxylate, sulfate or sulfonate groups. A non-ionic surfactant may be a polyether chain, preferably an alkyl-polyether chain. An amphoteric surfactant may contain both anionic and cationic groups and therefore behave as an anionic or cationic surfactant according to pH value or remain zwitterionic according to its structure. Zwitterionic surfactants usually behave independently of the pH value. A combination of non-ionic, zwitterionic and anionic surfactants is generally suitable. In specific cases, any of the surfactants named may also be used as the sole surfactant component. It was found that addition of an anionic and/or amphoteric surfactant can increase the creepage speed of the separating fluid in the interface between the layers of the multilayer system to be separated in the separating process.

The separating fluid may contain at least one non-ionic surfactant and one or several surfactants chosen from the group formed by anionic surfactants and amphoteric surfactants.

The non-ionic surfactant within the nanoscale dispersion has a concentration in the range from 2 percent by weight to 12 percent by weight, in particular from 5 percent by weight to 9 percent by weight.

The anionic surfactant and/or the amphoteric surfactant has a concentration of no more than 10 percent by weight within the nanoscale dispersion, in particular about 6 percent by weight.

To ensure that the non-ionic surfactant is soluble in water, the non-ionic surfactant has an HLB value in the range from 12 to 13. The HLB value (hydrophilic-lipophilic balance) indicates the strength between the hydrophilic head groups and the hydrophobic hydrocarbon group. The HLB value is defined by the product of the factor 20 with the relative share of the molar mass of the hydrophilic molecule part at the total molar mass.

The nanoscale dispersion also contains a hydrotrope to stabilize the dispersion. The hydrotrope is used to increase the capillary active forces of the surfactants used and to stabilize the nanoscale dispersion.

The hydrotrope serves to improve solubility of organic substances. Furthermore, the hydrotrope is able to incite the capillary forces of the surfactants by its interaction with the surfactant or the surfactants at the interface, which causes the resilience of the nanoscale dispersion to be increased. On the other hand, the surfactant concentrations used can be reduced without affecting the result. This is beneficial for the production costs of the separating fluid Amino-phosfonic acids or para-toluene sulphonic acid have turned out to be suitable hydrotropes.

The hydrotrope comprises a short-chained polar organic molecule. Chain lengths of up to six or up to five carbon atoms have turned out to be suitable. The hydrotrope can be aligned, e.g. in interfaces. Furthermore, the hydrotrope may interact beneficially with the surfactants or any present co-surfactants. The interaction of the surfactants with the hydrotrope leads to an amplification of the capillary forces that are usually responsible for separation.

The hydrotrope can comprise an organic acid or a salt of an organic acid. Organic acid molecules that, when used as acids, generate a pH value depending on the organic acid, can be preferably used as hydrotropes. Many separations of hard surfaces are facilitated by the acidic character of the micro-emulsion.

Among the amine salts, the alkanolamines of the organic acids can be used. The alkanolamines are in this case also considered hydrotropes according to the teachings of this disclosure.

To facilitate the formation of a micro-emulsion or a nanoscale dispersion, the nanoscale dispersion contains a co-surfactant. Isobutanol has turned out to be a suitable surfactant. In applications in which isobutanol is not suitable for industrialization because of its comparably low flash point, longer-chained alcohols or derivatives thereof can be used alternatively.

The co-surfactant contains a short-chained alcohol, preferably ethylhexanol and/or alkylmonoglycolether. Alcohols suitable must be somewhat to a little soluble in water and at the same time somewhat to well soluble in the organic phase. The alcohols also need to interact with the surfactants used at the interface and thus form a monomolecular liquid-crystalline layer at the interface together with the surfactants.

The separating fluid according to the invention may additionally contain a base component, in particular NaOH, to increase the pH value.

The separating fluid is used to remove at least sections of individual or several layers from the multilayer system in such a manner that the material of the layers substantially dissolved remains.

In contrast to known methods for separation, in particular of photovoltaic modules, it is possible to specifically remove only the bonding agent between the layers without at the same time dissolving the layer material. This method substantially facilitates the further recovery of the components of the multilayer system. The recovery rate may therefore also be improved as compared to the use of acid-based methods. The use of mineral acids may be dispensed with in the methods according to the disclosure.

Thus, use of suitable separating fluids may achieve a targeted delamination of the composite layers of the multilayer system. This requires wetting of the composite layers and in particular the edge and corner areas of the multilayer systems for the separating fluid to enter between the composite layers to separate the composite layers. Since the composite layers are not dissolved, but removed according to the invention, recovery of the layer material is simple. The method according to the disclosure therefore can be used for processing of the photovoltaic modules, battery cells or display screens.

The wash is performed in a container containing the separating fluid, in particular a submersion container, by placing the multilayer systems to be separated into the container with a relative motion between the separating fluid and the submersion container being generated.

This method leads to the separating fluid being applied to the separation layer to be removed, to produce the desired separation based on capillary forces there. In particular, several submersion baths with rotating drums can be used, as known separately, e.g. in galvanics. The term "wash" in the context of this disclosure means wetting with separating fluid or washing in the separating fluid of the disclosure. Rotating containers can also be used.

If the container has a funnel shape in the execution of the method, the wash may be performed in the funnel.

In the execution of the method, the container is rotated to produce the relative motion. This facilitates that the separating fluid comes into contact with the separating layer to be removed.

The relative motion is produced by stirring and transporting the separating fluid within the container. In particular, a funnel that contains a screw can be used as a container. The screw is used to set the separating fluid into motion on the one hand. On the other hand, the screw can enable entry and removal of the multilayer systems to be recycled as well.

The container is subjected to vibrations. In particular, a vibration table with a counter-flow can be used to enable particle removal as well.

The wash can be preferably performed in a counter-flow method.

The multilayer systems can be chopped mechanically and/or sorted by size before the wash. The chopping mainly serves to improve the separation performance due to an enlarged area of attack of the separating fluid. Additionally, the chopping also leads to simplified handling of the multilayer systems to be processed. Preferably, the multilayer systems (in particular photovoltaic modules or production wastes) are chopped into approx. 10 to 30 cm$^2$ large pieces. Other sizes of pieces are possible as well, however. The chopping can be performed by crushers, such as shredders, as known to the skilled person. Sorting by size also simplifies handling, since, for example, the screws can be designed and dimensioned for a specific size class of multilayer systems to be processed. The sorting by size can be performed by screening in the simplest case according to the invention.

If penetrating defects are produced in one or several of the composite layers of the multilayer system, there is also the advantage of increasing the area of attack of the separating fluid. The penetrating defect may be, for example a cut, hole or any other interruption of the layer system. The penetrating defects may be produced by scratching the multilayer system before or during treatment with the separating fluid.

When scratching, different numbers of layers may be affected. The defects may be produced by mechanical cutting agents, laser blasting, blasting with sharp-edged particles—e.g. sand blasting—bending, breaking, shredding, grinding. The defect is produced in at least one composite layer of the multilayer system that the separating fluid can enter. It is possible but not mandatory that the support substrate of the multilayer system is broken up for this penetration. Single sided coated substrates not covered with glass or film can be scratched.

The solid components of the multilayer system that are separated under application of the separating fluid are separated from the separating fluid containing the components after the wash, in particular by a swim-sink method. The separation is performed into non-ferrous components, in particular glass and/or aluminum, precious metals and/or plastic layer. The swim-sink method is possible due to the use of the nanoscale dispersion according to the invention. The swim-sink method can be performed more simply and cost-efficiently than the separating methods of conventional recycling methods that are based on thermal separation or use of acid. The swim-sink method is merely an example. Other methods known to the specialist for separation can be used as well. The EVA film can be recovered by separation. An aluminum frame, frequently used for attachment and stabilization of photovoltaic modules, can be recovered as well. This is, for example, not possible in a thermal separating process, since the EVA bond will be destroyed in thermal separation.

The separation can also comprise simple filtering to separate solid components in the simplest manner from the separating fluid containing the solid components.

The separation can be performed with a filter method in which the separated solid components of the multilayer system are retained, preferably mechanically. For example, a filter element can be used to keep back the separated solid components.

In an alternative aspect, the separation can be performed by an air bubble floating method. In this method, the separated solid components, which are thin and light, can be carried by air bubbles and thus suspended due to their relatively large surface. The heavier, thicker-walled particles, in contrast, deposit on the bottom, so that separation is achieved.

The separation is also possible by using the differences of the magnetic or electrical properties of the materials to be separated.

Generally, use of the nano-dispersion is beneficial for the quality of the available recyclable materials. The glass fraction from the conventional photovoltaic module processing could only be used in foam glass or insulation material production before, for example. The method of the disclosure, in contrast, permits delivering glass fraction of a high quality.

Environmental compatibility of the recycling method is further improved if the separating fluid is recovered and reused after the wash. The properties of the separating fluid permit separation of the multilayer systems so that the individual components can be easily separated and the separating fluid can thus be reused.

The use of the separating fluid in connection with the separation of multilayer systems such as photovoltaic modules, leads to an environmentally compatible recyclability of photovoltaic modules. A high recycling rate can be achieved. The quality of the recycling products achieved is also better than in case of use of, e.g., acids, such as in particular mineral acids, for separation.

Another use of the separating fluid is its use for separating battery modules and accumulators. In this case, it was demonstrated that the firmly bonded carbonic layers essentially come loose directly from the metal layers, so that thin, flat fragments of the respective layers are gained that can be easily separated. The materials are not substantially chemically dissolved or otherwise changed in this. In particular, pursuant to this use according to the invention it is not required to use any strong acids, such as mineral acids, to achieve the intended removal of the carbon layers from the metal layers.

Another use of the separating fluid is its use for separating flat screens and similar display screens. The separating fluid is suitable for recovering plastics, glasses and semi-conductors for example for the separation of, in particular transparent, optically active and other, films, glasses, transparent semiconductors and other layers.

The disclosure also includes a facility for performance of the method that comprises means for production of the penetrating defects penetrating one or several composite layers of the multilayer system.

The facility may comprise at least one container, in particular the above-mentioned submersion container. The container accepts the separating fluid and the multilayer systems to be processed.

In the operation of the facility, the container has rotating drums to improve contact of the separating fluid with the multilayer system to be separated by rotation.

In another aspect of the facility, conveying devices for production of the relative motion and/or for entry and/or removal of the multilayer systems to be separated are provided. Specifically, the conveying devices may be implemented as one or several screws according to the invention.

If the container in the facility has a plate-like plane with means for application of vibration, contact of the separating fluid with the multilayer systems to be separated can be achieved in the most beneficial manner possible, with in particular counter-flows allowing particle removal.

Performance of the method is beneficial if electronic components are manually disassembled first. This disassembly is best performed before any other steps of the method. In particular, disassembly should take place before a chopping step.

BRIEF DESCRIPTION OF THE DRAWINGS

For a more complete understanding of the present invention and the advantages thereof, reference is now made to the following description and the accompanying drawings, in which.

DETAILED DESCRIPTION OF THE PREFERRED EMBODIMENTS

Figure 1:
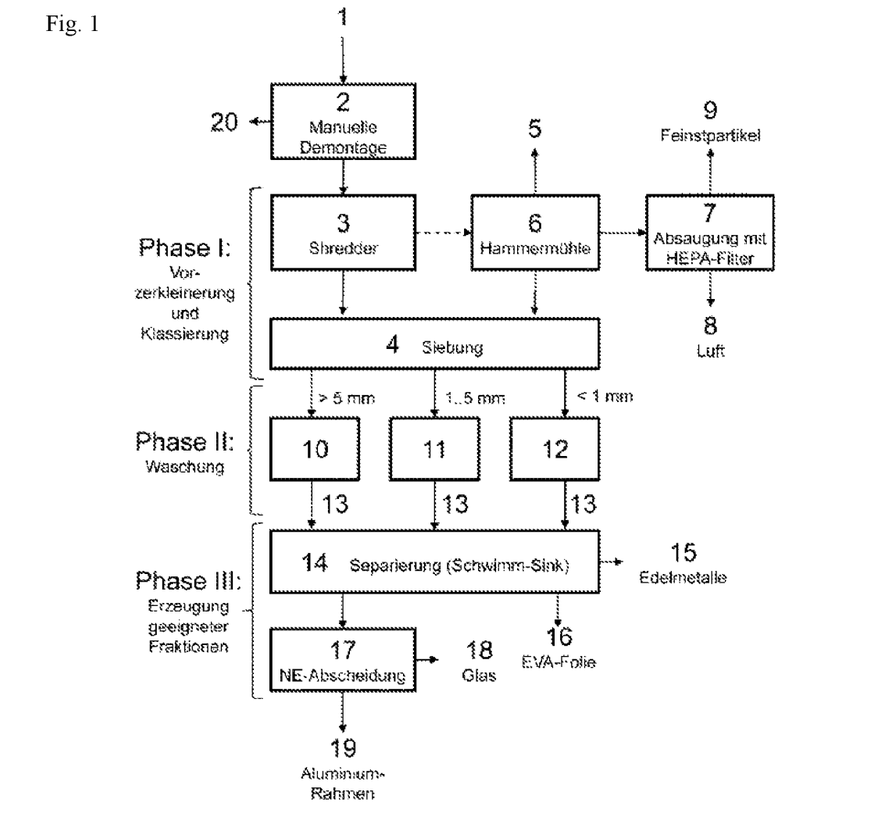
FIG. 1 is a flow diagram of a method of using a separating fluid in accordance with an embodiment of the present invention.

FIG. 1 shows a flow diagram for illustration of the method for separating multilayer systems, in particular photovoltaic modules, for the purpose of recycling.

Modules with EVA bond in the glass-glass composite/ glass plastic, possibly with frame, are suitable input material 1 for the method. In an upstream step of the method 2, any present electronic components, such as connection sockets, are disassembled from the input material 1. The upstream step of the method 2 can take place at a manual disassembly workplace. The input material 1 can also be waste materials or other composite materials, such as but not limited to, composite materials of polymers and paper.

The next step 3 includes pre-chopping of the input material 1. The pre-chopping leads to an increased area of attack of the nanoscale dispersions. The increased area results in shortened process times. In step 4, the material acquired after chopping step 3 is subjected to size sorting by screening.

Equally, the input material 5 may also be a quantity of composite materials without bonding, such as semi-finished goods. The input material 5 is supplied to a hammer mill 6 and chopped in the hammer mill 6. Dust produced in the chopping step 3 or the hammer mill 6 is separated into filtered air 8 and microparticles 9 according to the extraction step 7, preferably with a HEPA filter (HEPA: high efficiency particulate air filter).

As a result of the screening, the input material 1 chopped in the chopping step 3 or the alternative input material 5 chopped in the hammer mill 6 is present in three different sizes according to the execution example described here. A screening step 4 separates coarse material and particles from each other that have different separating properties in the baths 10, 11, 12.

The benefit of the screening step 4 is that large particles that are easier to filter can be washed off from large materials. On the other hand, small glass splinters with even smaller particles will results in a high filter/separation effort. The ratio of 95% of particles with sizes >5 mm to 5% of particles with sizes <1 mm can also be applied.

The screening step 4 is performed with a simple tumbler. After the screening step 4, dosage containers (not illustrated in FIG. 1) can be used for interim buffering and will then serve to fill the baths 10, 11, 12 for performance of the actual separation method.

The baths 10, 11, 12 are filled with shards of the input material 1 or the alternative input material 5 up to a volume of about 40%. The remaining roughly 60% of the volume of each of the baths 10, 11, 12 are topped up with nanoscale dispersions according to the invention. The nanoscale dispersion can be aligned in particular specifically with the input material 1 or the alternative input material 5 to achieve best process times at the lowest costs. It is also possible to use the nanoscale dispersions that can separate different photovoltaic modules of the above kind in the same way.

The nanoscale dispersions according to the invention are made up as disclosed in the introduction of the description. In particular, they are made up according to one of the following compositions where the part missing to 100% is topped up with water:

Example 1

| Component | % by weight | Substance | Contribution to the aqueous component |
|---|---|---|---|
| Anionic surfactant | 17.8 | Leuna alkane sulfonate 30 (sodium alkane sulfonate mixture with an average chain length C15 (C12-C18) based on n-paraffin - 34% watery solution | 11.8 |
| Non-ionic surfactant | 5.9 | Polyethylene glycol-mono-n-dodecyl/tridecyl/tetradecyl/-pentadecylether as substance mixture of | |

-continued

| Component | % by weight | Substance | Contribution to the aqueous component |
|---|---|---|---|
| Hydrotrope | 3.5 | compositions with 4 to 25 ethylenoxide units Cublen R 60 [N-(2-hydroxyethyl)-N,N-bis-methylenephosphonic acid in the form of a 60% watery solution | 1.4 |
| Co-surfactant | 8.9 | Butanol-2 | |
| Organ. Phase | 7.0 | Xylen (techn.) | |
| Addition of water | 56.90 | | |
| Watery component total | 70.1 | Total of addition of water and contributions to the watery component | |

Example 2

| Component | % by weight | Substance | Contribution to the aqueous component |
|---|---|---|---|
| Anionic surfactant | 6.0 | Leuna alkane sulfonate 95 (sodium alkane sulfonate mixture with an average chain length C15 (C12-C18) based on n-Paraffin) | |
| Non-ionic surfactant | 6.0 | Polyethylene glycol-mono-n-dodecyl/tetradecylether as substance mixture with 9 ethylenoxide units | |
| Hydrotrope | 2.0 | Dimethylaminomethane-bis-phosphonic acid | |
| Co-Surfactant | 9.0 | Ethylhexanol | |
| Organic phase | 8.0 | Mesitylen | |
| Addition of water | 69.0 | | |
| Aqueous component total | 69.0 | Total of addition of water and contributions to the watery component | |

In the nanoscale dispersions according to example 2, NaOH may be added to increase the pH value.

Example 3

| Component | % by weight | Substance | Contribution to the aqueous component |
|---|---|---|---|
| Amphoteric surfactant | 5.0 | N,N-dimethyl-N-tetradecyl-ammoniopropanesulfonate | |
| Non-ionic surfactant | 6.0 | Polyethylene glycol-mono-n-dodecyl/tetradecylether as substance mixture with 9 ethylenoxide units | |
| Hydrotrope | 2.0 | Dimethylaminomethane-bis-phosphonic acid | |
| Co-Surfactant | 9.0 | Ethylhexanol | |
| Organic phase | 7.0 | Hydrosol P 180 EA | |
| Addition of water | 71.0 | | |

| Component | % by weight | Substance | Contribution to the aqueous component |
|---|---|---|---|
| Watery component total | 71.0 | Total of addition of water and contributions to the watery component | |

In example 3, the anionic surfactant is replaced by an amphoteric surfactant in contrast to examples 1 and 2.

Example 4

| Component | % by weight | Substance | Contribution to the watery component |
|---|---|---|---|
| Amphoteric surfactant | 3.0 | N,N-dimethyl-N-tetradecyl-ammoniopropanesulfonate | |
| Anionic surfactant | 4.0 | Leuna alkane sulfonate 95 (sodium alkane sulfonate mixture with an average chain length C15 (C12-C18), based on n-paraffin | |
| Non-ionic surfactant | 6.0 | Polyethylene glycol-mono-n-dodecyl/tetradecylether as substance mixture with 9 ethylenoxide units | |
| Hydrotrope | 2.0 | Dimethylaminomethane-bis-phosphonic acid | |
| Co-surfactant | 9.0 | Butyl glycol ether | |
| Organic phase | 5.0 | Diesel fuel | |
| Addition of water | 71 | | |
| Watery component total | 71.0 | Total of addition of water and contributions to the watery component | |

In example 4, an anionic surfactant as well as an amphoteric surfactant is used in addition to the non-ionic surfactant.

One or several of the nanoscale dispersions listed act for a certain exposure time that depends on the properties of the input material 1 or the alternative input material 5 in the baths 10, 11, 12. The effect occurs due to comprehensive wetting in several application points where the separating fluid can enter between the composite layers to be separated, move along the interface and dissolve the bond there, for a certain time. This does not have to take place in submersion containers 11, 12, 13.

After the separating process in the submersion containers 10, 11, 12, a loaded separating fluid 13 is treated in a separation step 14. The separation step 14 serves to separate the components of the input material 1 or the alternative input material 5 that are present after washing in the submersion containers 10, 11, 12, as well as the separating fluid in the form of nanoscale dispersion. This step is only illustrated as a schematic in FIG. 1.

In the simplest case, a swim-sink separation in connection with suitable filtering is sufficient. The light weight particles in the loaded separating fluid with large surface-volume ratios of the removed layers may be separated from larger, heavier particles such as glass fragments with small surface-volume ratios. The separation takes place using gravity, the flow conduct and/or the surface tension. Simple filtering can also be used for the purpose of the separation. The remaining parts, i.e. mainly glass, EVA and aluminum, are separated in subsequent process steps that can also be performed in subsequent areas of the facility.

For example, EVA can be separated by the swim-sink separation, glass by depositing in the same container, aluminum by the separation of the non-ferrous components. These steps can each be performed in separate areas of the facility or in the same area of the facility.

As shown in FIG. 1, precious metals 15, EVA film 16 and non-ferrous separations 17 are separated from the loaded separating fluid 13. The term "non-ferrous separation" 17 means separations of non-ferrous components, such as glass or aluminum. In a separate separation process that is not detailed further in FIG. 1, the non-ferrous separations 17 in turn are once again separated into the recyclable materials glass 18 and the aluminum frame 19. The recyclable materials, i.e. precious metals 15, EVA film 16, non-ferrous separations 17, comprising glass 18 and aluminum frame 19, are not dissolved. Therefore, the separation in step 14 is technically simpler compared with the art. The quality of the resulting recycling materials 15, 16, 17, 18, 19 regarding reusability is not limited by the recycling processes as such.

The electronic components 20 resulting from the upstream step of the method 2 during disassembly of electronic components can also be delivered for recycling.

Figure 2:
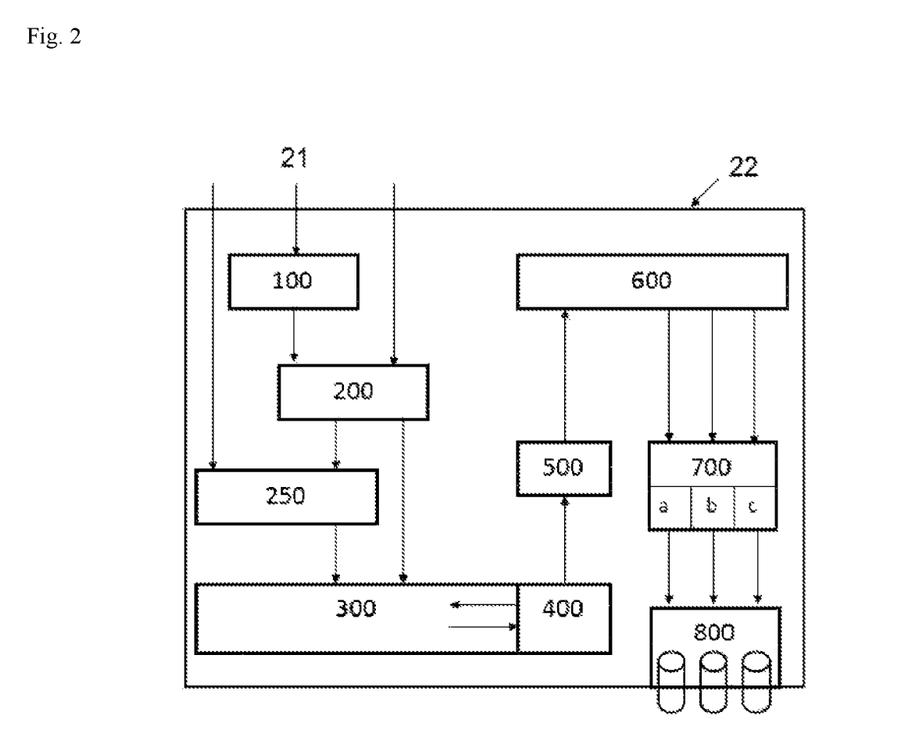
FIG. 2 is a diagram of another aspect of a method for separating multilayer systems in accordance with an embodiment of the present invention.

After the upstream step of the method 2, the method can thus be structured in the following three procedural groups:
Phase I: Pre-chopping and sorting by size
Phase II: Wash with nanoscale dispersion
Phase III: Production of suitable fractions for utilization FIG. 2 schematically shows another aspect of the method for separating the multilayer systems. As shown in the schematic flow chart according to FIG. 2, multilayer material 21 to be separated is supplied to a facility 22 for separating the multilayer material. The multilayer material 21 can optionally be supplied to a preliminary stage 100 for disassembly first. In the preliminary stage 100, pieces to be treated separately, e.g. pieces not made of the multilayer material to be separated, are removed. In the preliminary stage 100, pieces of the multilayer materials 21 to be separated that must be subjected to a different treatment, e.g. than a main component of the multilayer material, due to the type of the multilayer materials, can also be separated.

After passing the preliminary stage 100, the part of the multilayer material 21 that remains after disassembly is supplied to another preliminary stage 200 for production of attack points. Alternatively, the multilayer material 21 can also be directly supplied to the preliminary stage 200 for production of attack points within the facility 1000 for separating the multilayer materials.

This will be suitable if disassembly of the multilayer material 21 is not required or desired. Within the preliminary stage 200 for production of attack points, defects penetrating one or several layers of the multilayer system are produced to increase the area of the attack points of the separating fluid. This can be done by scratching of the multilayer system with mechanical cutting agents, by treatment with laser jets, by blasting with sharp-edged particles, e.g., sand blasting, by bending, crushing, shredding, grinding or other common procedures known to the specialist as such.

After the preliminary stage 200 for production of the attack points, the multilayer material 21 is supplied to the interim storage stage 250. In the interim storage stage 250, it is also possible to ensure supply suitable for the subsequent processing stage. In the interim storage stage 250, different supply goods can be mixed as well.

From the interim storage stage 250, which contains the interim storage in suitable containers, the multilayer material 21 to be processed is supplied to a wetting stage 300. Within the wetting stage 300, the multilayer material 21 to be separated is wetted with the separating fluid. This is done in a submersion bath containing the separating fluid or in the form of a sprinkler lane.

After the wetting stage 300, the multilayer material 21 to be separated goes through a separating stage 400. Within the separating stage 400, the layer material delaminated during the wetting stage 300 is separated from a substrate material as part of the multilayer material 21 and taken up by the separating fluid without being dissolved in the separating fluid.

The process may be facilitated by circulation of the separating fluid according to the invention. This is indicated by the arrows between the stages 300 and 400 in FIG. 2.

A separation stage 500 follows the separating stage 400. During the separation stage 500, layer fragments taken up by the separating fluid in the separating stage 400 are separated by a suitable method. This may be done by suspension in the air bubble flow according to a floating method, swim-sink separation or filtration.

The Separation stage 500 is followed by a fragmenting stage 600 in which the layer fragments separated during separating stage 400 and separated from the liquid separating fluid according to the invention in the separation stage 500 are fragmented into different material fractions.

After the fragmenting stage 600, the individual material fractions a, b, c are further refined in an after-treatment stage 700. Refining of the individual material fractions a, b, c may, e.g., comprise of breaking up, cleaning or physical or chemical processing.

Finally, the material fractions a, b, c refined in the scope of the after-treatment stage 700 are supplied to a packaging stage 800 and packed for use separately.

LIST OF REFERENCE NUMERALS

1 Input material
2 Upstream step of the method
3 Chopping step
4 Screening
5 Alternative input material
6 Hammer mill
7 Extraction step
8 Filtered air
9 Microparticles
10 Bath
11 Bath
12 Bath
13 Loaded separating fluid
14 Separation step
15 Precious metals
16 EVA film
17 Non-ferrous separations
18 Glass
19 Aluminum frame
20 Electronic components
  I Phase of the method
  II Phase of the method
  III Phase of the method
21 Multilayer material
22 Facility for separating multilayer material
100 Preliminary stage for disassembly
200 Preliminary stage for production of attack edges
250 Interim storage stage

300 Wetting stage
400 Separating stage
500 Separation stage
600 Fragmenting stage
700 After-treatment stage
800 Packaging stage

What is claimed is:

1. A method for separating multilayer systems comprising one or several layers comprising:
   washing the multilayer systems with a separating fluid comprising a nanoscale dispersion to form undissolved separated components, wherein the nanoscale dispersion comprises an organic component, an aqueous component and at least one surfactant; and
   collecting one or more of the undissolved separated components from the multilayer systems.

2. The method according to claim 1, further comprising:
   filling a container with the separating fluid; and
   generating a relative motion between the separating fluid and the container.

3. The method according to claim 2, wherein the relative motion is generated by at least one of rotation, stirring, vibrating or conveying of the separating fluid within the container.

4. The method according to claim 1, further comprising chopping the multilayer systems prior to the washing.

5. The method according to claim 1, further comprising generating defects penetrating the one or several layers of the multilayer system.

6. The method according to claim 1, further comprising sorting of the undissolved separated components by a swim-sink method.

7. The method according to claim 1, further comprising separation of the undissolved separated components by a filter method.

8. The method of claim 1, further comprising collecting the separating fluid after washing the multilayer system and recovering the separating fluid after the washing by separating the undissolved separated components of the separating fluid.

9. The method of claim 1, wherein the surfactant is selected from the group formed of anionic surfactants, non-ionic surfactants, amphoteric surfactants, or combinations thereof.

10. The method of claim 1, wherein the separation fluid contains at least one anionic surfactant and one or more surfactants selected from the group formed of non-ionic surfactants or amphoteric surfactants.

11. The method of claim 1, wherein the nano-scale dispersion further contains a hydrotrope for stabilization of the dispersion.

12. The method of claim 11, wherein the hydrotrope comprises a short-chain polar organic molecule, an organic acid, or a salt of an organic acid.

13. The method of claim 1, wherein the nanoscale dispersion contains a short-chain alcohol.

14. The method of claim 1 wherein the aqueous component has within the nanoscale dispersion a concentration of at least 60 wt. %.

15. The method of 1, wherein the multi-layer systems are mechanically shredded before the washing is performed.

* * * * *